United States Patent
Mizugaki

(10) Patent No.: US 11,690,297 B2
(45) Date of Patent: Jun. 27, 2023

(54) VIBRATION DEVICE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

(*) Notice: Subject to any disclaimer, the term of this patent is extended or adjusted under 35 U.S.C. 154(b) by 420 days.

(21) Appl. No.: 16/952,396

(22) Filed: Nov. 19, 2020

(65) Prior Publication Data

US 2021/0159385 A1     May 27, 2021

(30) Foreign Application Priority Data

Nov. 22, 2019 (JP) ................ 2019-211164

(51) Int. Cl.
| | |
|---|---|
| *H01L 41/047* | (2006.01) |
| *H10N 30/20* | (2023.01) |
| *H10N 30/87* | (2023.01) |
| *B06B 1/06* | (2006.01) |

(52) U.S. Cl.
CPC ......... *H10N 30/871* (2023.02); *B06B 1/0644* (2013.01); *H10N 30/20* (2023.02); *H10N 30/877* (2023.02)

(58) Field of Classification Search
CPC .................................................. B06B 1/0644
See application file for complete search history.

(56) References Cited

U.S. PATENT DOCUMENTS

| | | |
|---|---|---|
| 2006/0006539 A1 | 1/2006 | Matsui et al. |
| 2011/0001249 A1 | 1/2011 | Law et al. |
| 2021/0273628 A1* | 9/2021 | Takeuchi ............ H03H 9/1021 |
| 2022/0239274 A1* | 7/2022 | Matsuzawa ......... H03H 9/1014 |
| 2022/0239275 A1* | 7/2022 | Itasaka ................ H03H 9/0557 |

FOREIGN PATENT DOCUMENTS

| | | |
|---|---|---|
| JP | 2006-019431 | 1/2006 |
| JP | 2011-014910 | 1/2011 |

* cited by examiner

*Primary Examiner* — J. San Martin
(74) *Attorney, Agent, or Firm* — Rankin, Hill & Clark LLP

(57) ABSTRACT

A vibration device includes a substrate having a first surface and a second surface at an opposite side to the first surface, a vibration element disposed on the first surface, a first through electrode which penetrates the substrate, and is configured to electrically couple the power supply interconnection disposed on the second surface and the first circuit block disposed on the first surface, and a second through electrode which penetrates the substrate, and is configured to electrically couple the power supply interconnection and the second circuit block including an analog circuit disposed on the first circuit, wherein R1>R4 and R2>R4, in which R1 is an electric resistance of the first through electrode, R2 is an electric resistance of the second through electrode, and R4 is an electric resistance of a zone of the power supply interconnection coupling the first through electrode and the second through electrode.

4 Claims, 8 Drawing Sheets

VIBRATION DEVICE

The present application is based on, and claims priority from JP Application Serial Number 2019-211164, filed Nov. 22, 2019, the disclosure of which is hereby incorporated by reference herein in its entirety.

BACKGROUND

1. Technical Field

The present disclosure relates to a vibration device.

2. Related Art

The integrated circuit structure described in JP-A-2011-014910 (Document 1) has a semiconductor substrate, a variety of circuit elements such as a transistor disposed on a front surface of the semiconductor substrate, a plurality of through silicon via holes penetrating the semiconductor substrate, and a redistribution line for the ground which is disposed on the rear surface of the semiconductor substrate, and electrically couples the plurality of through silicon via holes in parallel to each other.

However, in the integrated circuit structure in Document 1, there is a possibility that the noise generated in a first circuit block to which a certain through silicon via hole is connected is transmitted via the redistribution line to a second circuit block to which another through silicon via hole is connected. In particular, when an oscillation circuit including an analog circuit easily affected by the noise is provided to the second circuit block, there is a possibility that the phase noise of the oscillation circuit increases due to the noise.

SUMMARY

A vibration device according to an application example includes a substrate having a first surface and a second surface at an opposite side to the first surface, a vibration element disposed on the first surface of the substrate, a first circuit block disposed on the first surface, a second circuit block disposed on the first surface and including an analog circuit, a power supply terminal disposed on the second surface, a power supply interconnection disposed on the second surface, and coupled to the power supply terminal, a first through electrode which penetrates the substrate, and is configured to electrically couple the power supply interconnection and the first circuit block to each other, and a second through electrode which penetrates the substrate, and is configured to electrically couple the power supply interconnection and the second circuit block to each other in parallel to the first through electrode, wherein R1>R4 and R2>R4, in which R1 is an electric resistance of the first through electrode, R2 is an electric resistance of the second through electrode, and R4 is an electric resistance of a zone of the power supply interconnection coupling the first through electrode and the second through electrode to each other.

In the vibration device according to the application example, a constituent material of the power supply interconnection may be a metal material, and a constituent material of the first through electrode and the second through electrode may be electrically-conductive polysilicon.

In the vibration device according to the application example, the second circuit block may include at least one of a constant voltage generation circuit, an oscillation circuit, a control voltage generation circuit, and a phase synchronization circuit as the analog circuit.

In the vibration device according to the application example, the first circuit block may include at least one of a logic circuit, a storage circuit, and an output buffer circuit.

DESCRIPTION OF AN EXEMPLARY EMBODIMENT

A vibration device according to the present application example will hereinafter be described in detail based on an embodiment shown in the accompanying drawings.

First Embodiment

Figure 1:
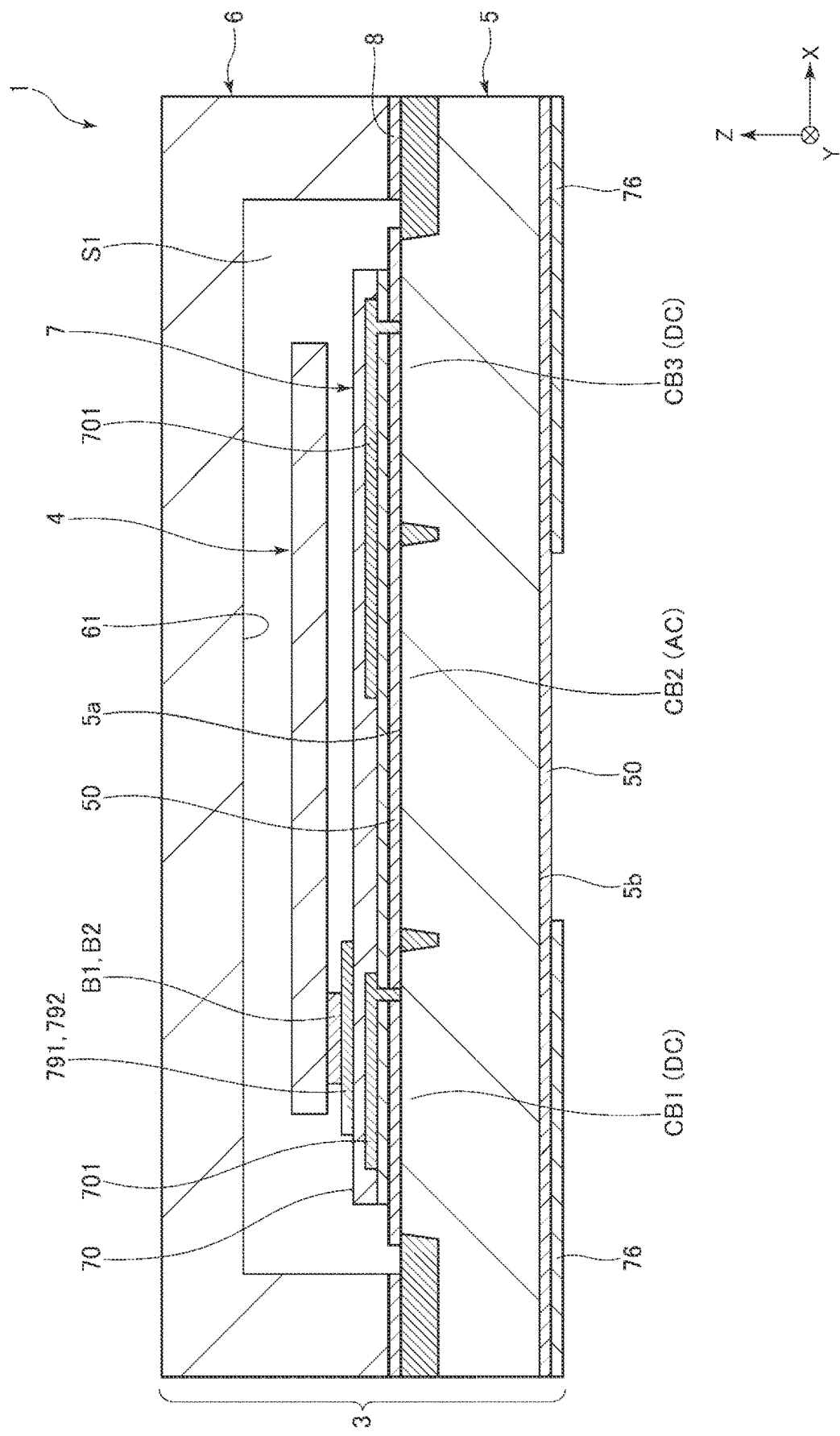
FIG. 1 is a cross-sectional view showing a vibration device according to a first embodiment.
Figure 2:
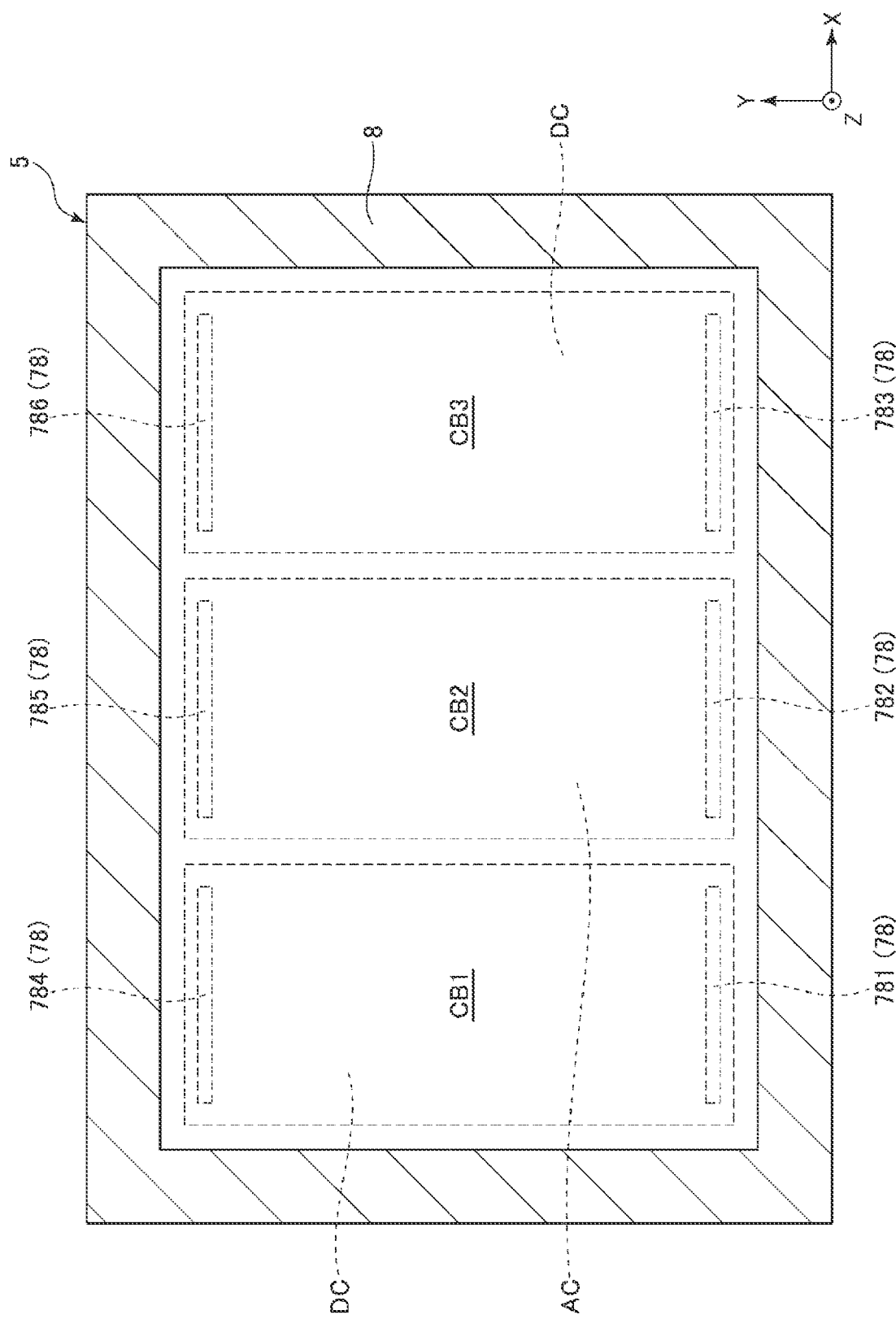
FIG. 2 is a top view of a substrate.
Figure 3:
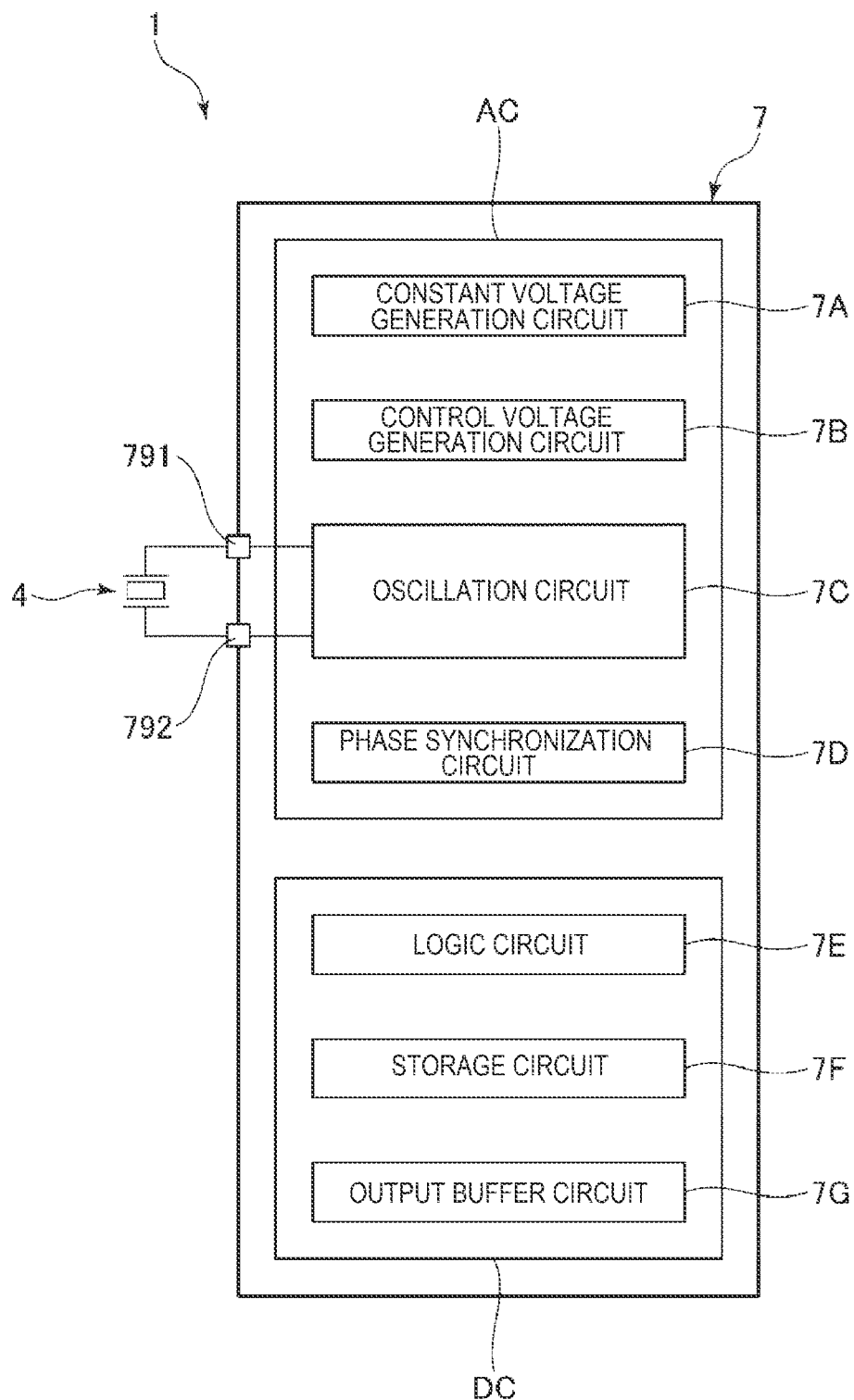
FIG. 3 is a block diagram showing a configuration of an integrated circuit.
Figure 4:
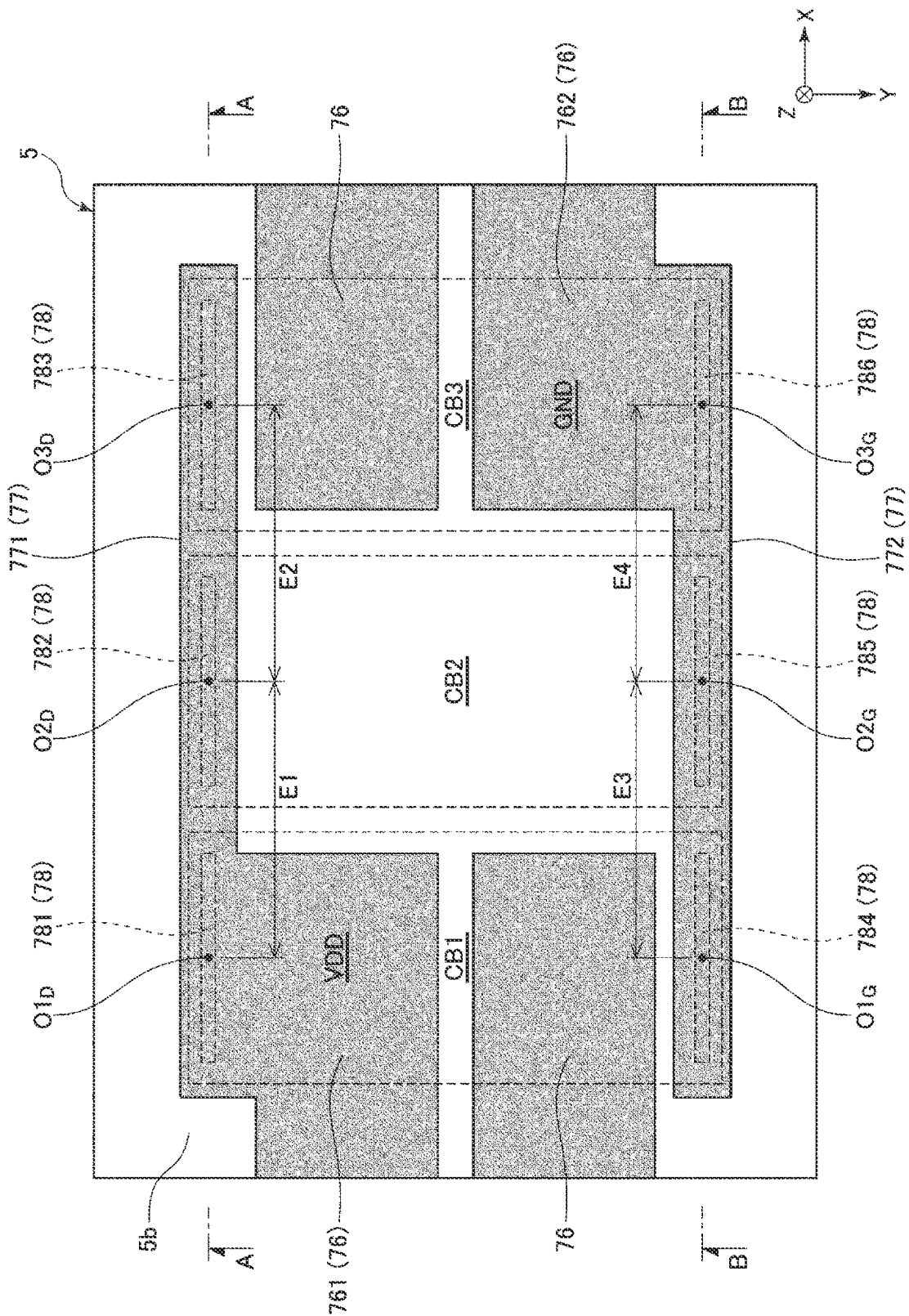
FIG. 4 is a bottom view of the substrate.
Figure 5:
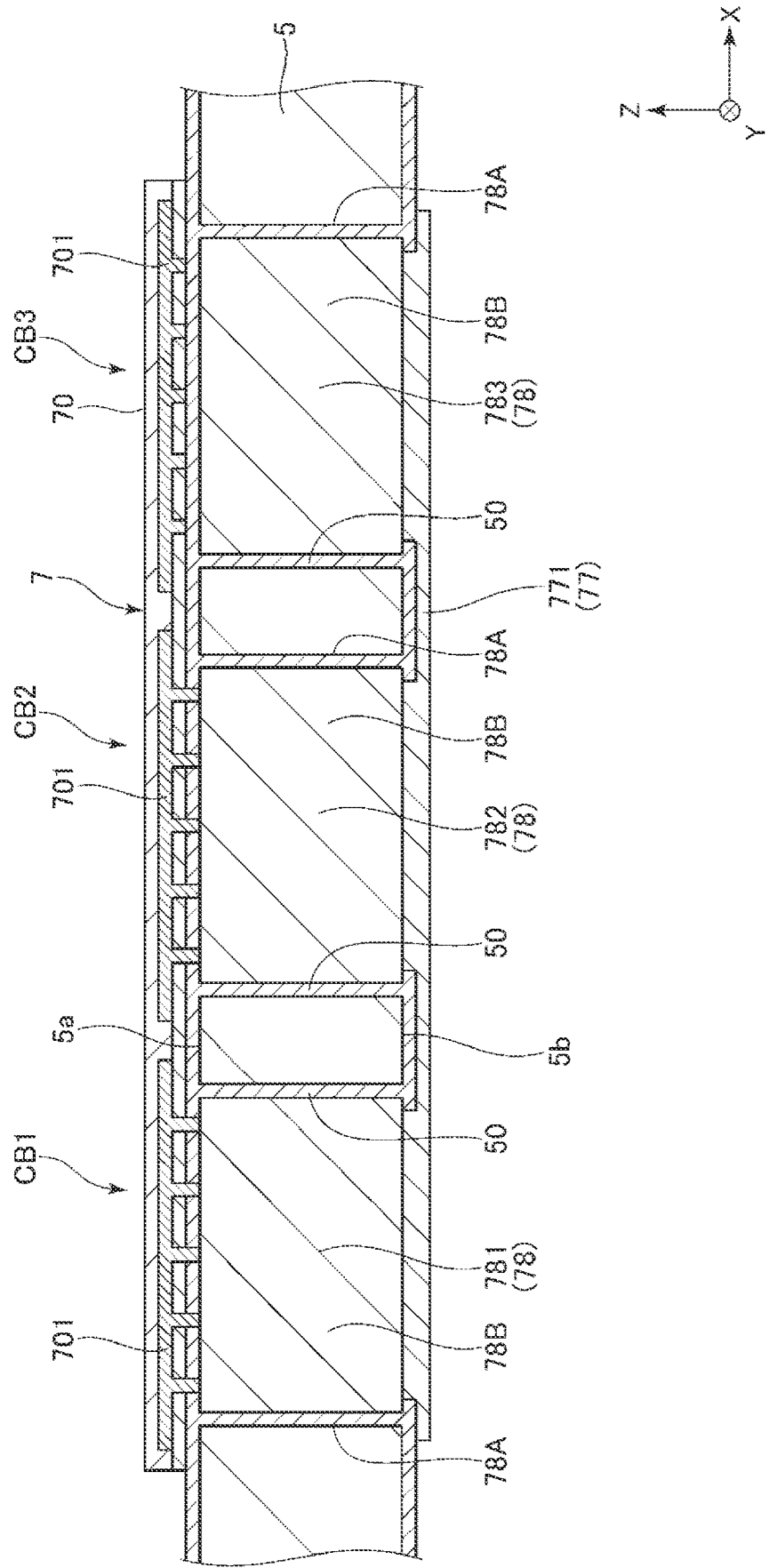
FIG. 5 is a cross-sectional view along the line A-A in FIG. 4.
Figure 6:
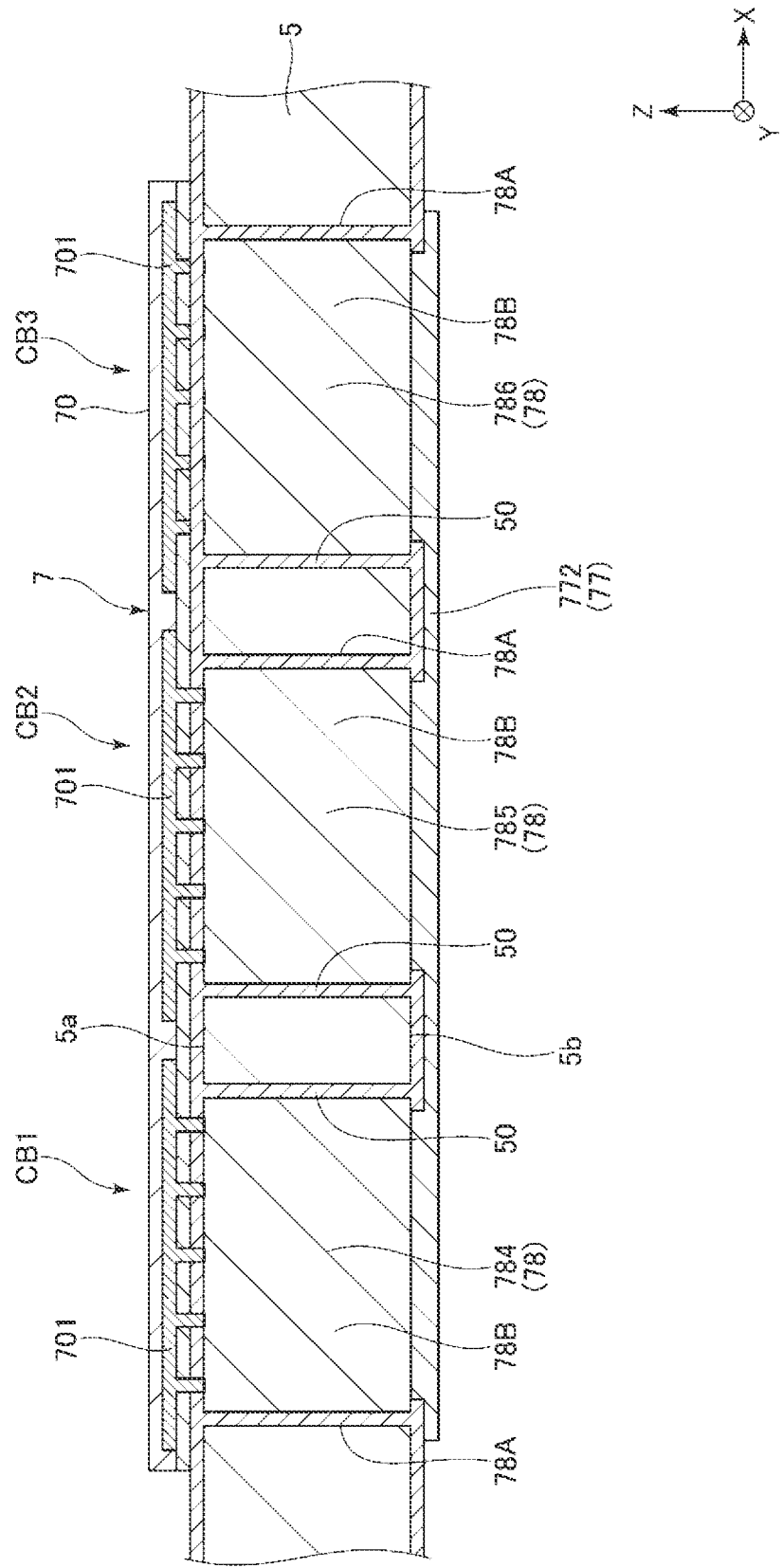
FIG. 6 is a cross-sectional view along the line B-B in FIG. 4.
Figure 7:
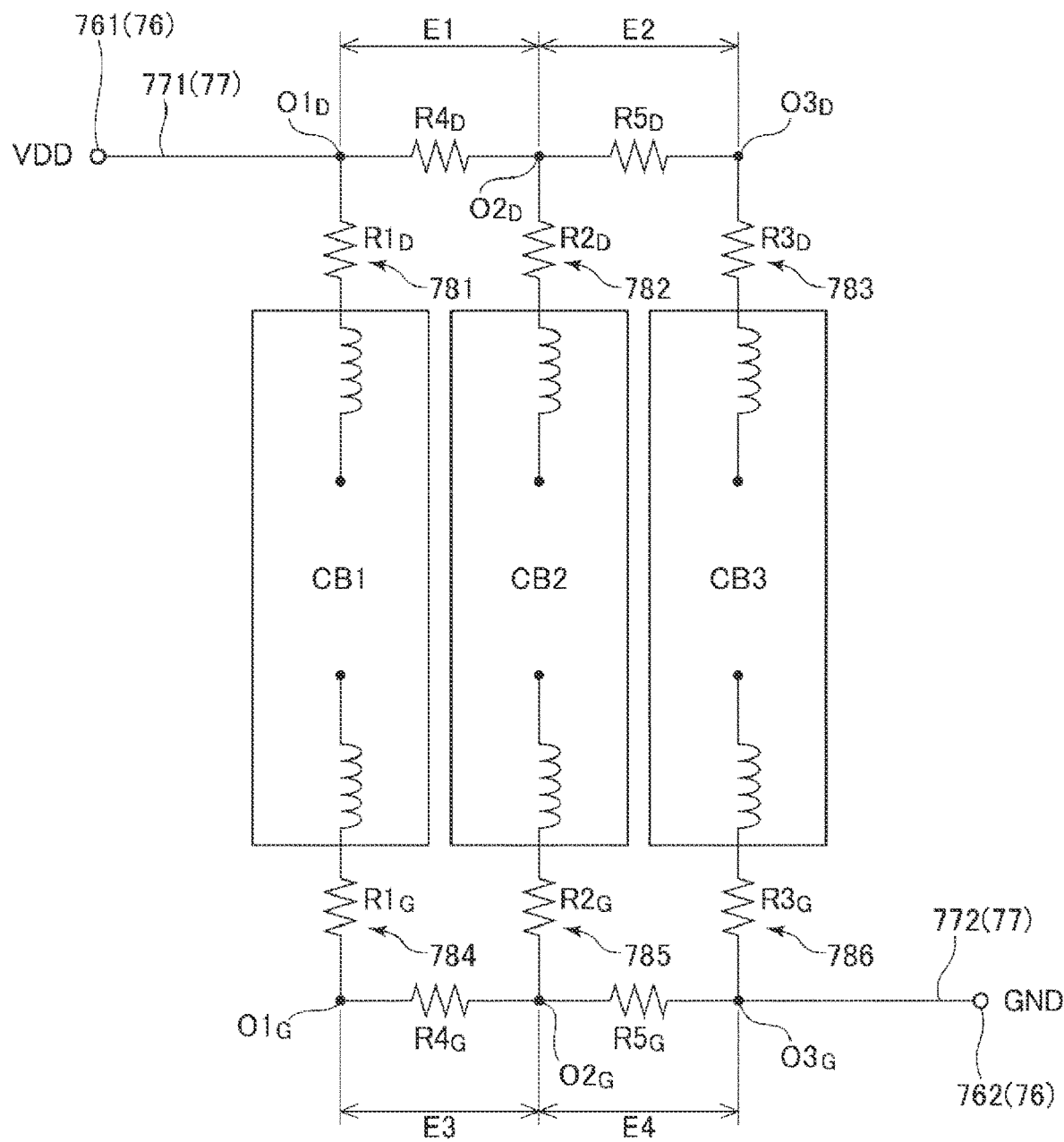
FIG. 7 is an equivalent circuit schematic of channels for coupling terminals and the integrated circuit to each other.
Figure 8:
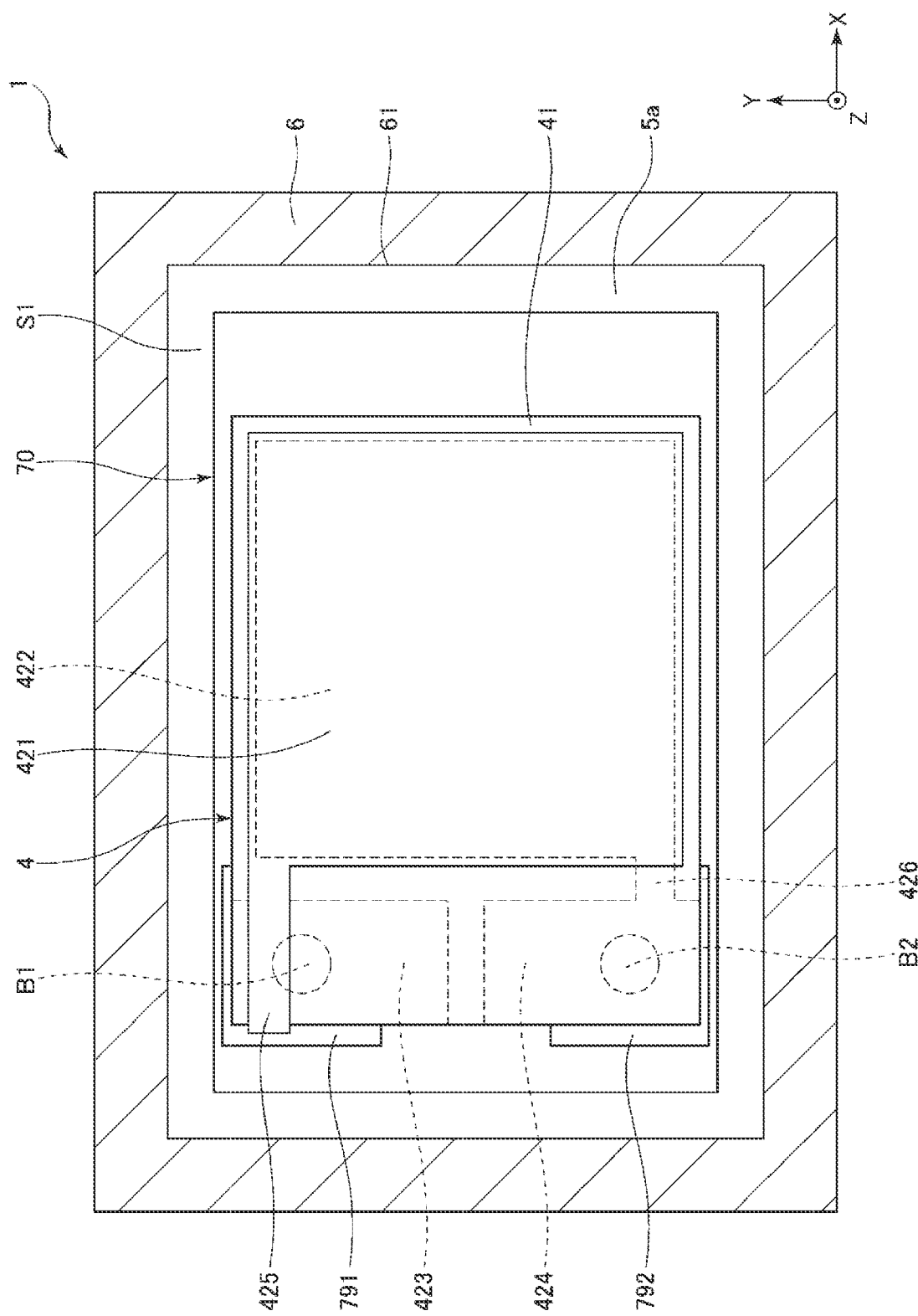
FIG. 8 is a plan view showing a vibration element provided to the vibration device shown in FIG. 1.

FIG. 1 is a cross-sectional view showing the vibration device according to a first embodiment. FIG. 2 is a top view of a substrate. FIG. 3 is a block diagram showing a configuration of an integrated circuit. FIG. 4 is a bottom view of the substrate. FIG. 5 is a cross-sectional view along the line A-A in FIG. 4. FIG. 6 is a cross-sectional view along the line B-B in FIG. 4. FIG. 7 is an equivalent circuit schematic of channels for coupling terminals and the integrated circuit to each other. FIG. 8 is a plan view showing a vibration element provided to the vibration device shown in FIG. 1.

It should be noted that in FIG. 1, FIG. 2, FIG. 4, FIG. 5, FIG. 6, and FIG. 8, three axes perpendicular to each other are illustrated as an X axis, a Y axis, and a Z axis for the sake of convenience of explanation. Further, the side to which the arrow of the Z axis faces is also referred to as an "upper side," and the opposite side is also referred to as a "lower side." Further, the plan view viewed along the Z axis is also referred to simply as a "plan view."

The vibration device 1 shown in FIG. 1 is an oscillator, and in particular is a VCXO (voltage-controlled crystal oscillator). It should be noted that the vibration device 1 is not particularly limited, and can be an oscillator other than the VCXO such as an OCXO (oven-controlled crystal oscillator) or a TCXO (temperature-compensated crystal oscillator), or can also be a device other than the oscillator. Such a vibration device 1 has a package 3 and a vibration element 4 housed in the package 3.

The package 3 has a substrate 5 as a semiconductor substrate, and a lid 6. The substrate 5 is a silicon substrate. It should be noted that the substrate 5 is not particularly limited, and it is possible to use a semiconductor substrate other than the silicon substrate, for example, a semiconductor substrate made of Ge, GaP, GaAs, InP, or the like.

Further, the substrate 5 has a plate-like shape, and has an upper surface 5a as a first surface and a lower surface 5b as a second surface, wherein the first surface and the second surface are in an obverse-reverse relationship. The surfaces of the upper surface 5a and the lower surface 5b are covered with an insulating film 50. Further, on the upper surface 5a of the substrate 5, there is disposed the vibration element 4. Further, on the upper surface 5a, there is formed an integrated circuit 7 electrically coupled to the vibration element 4. The integrated circuit 7 is formed of a plurality of active elements not shown such as transistors formed on an upper surface side of the substrate 5 by doping an impurity such as phosphorus (P) or boron (B), and a wiring layer 70 disposed on the upper surface 5a of the substrate 5 and provided with interconnections 701 for electrically coupling the active elements to each other. It should be noted that in the present specification, when using expressions such as "something is disposed on a surface side" or "something is located on a surface side," it is possible for that thing to be disposed so as to have direct contact with the surface, or it is possible for another thing to be disposed between that thing and the surface.

Further, as shown in FIG. 1 and FIG. 2, the integrated circuit 7 has a first circuit block CB1 including a digital circuit DC, a second circuit block CB2 including an analog circuit AC, and a third circuit block CB3 including a digital circuit DC. Further, the first, second, and third circuit blocks CB1, CB2, and CB3 are disposed at distances so as not to overlap each other in the plan view from a direction along the Z axis. In particular, in the present embodiment, the first, second, and third circuit blocks CB1, CB2, and CB3 are arranged side by side along the X axis. In other words, the second circuit block CB2 is disposed so as to be sandwiched between the first circuit block CB1 and the third circuit block CB3. It should be noted that the integrated circuit 7 is not particularly limited providing the integrated circuit 7 has the first circuit block CB1 and the second circuit block CB2, and for example, it is possible to omit the third circuit block CB3, or it is also possible to further include one or more circuit blocks. Further, the arrangement of the first, second, and third circuit blocks CB1, CB2, and CB3 is not particularly limited as long as power interconnections described later can be disposed.

Further, as shown in FIG. 3, the vibration device 1 has a constant voltage generation circuit 7A, a control voltage generation circuit 7B, an oscillation circuit 7C, and a phase synchronization circuit 7D which is a PLL circuit as the analog circuit AC, and at least one of these circuits 7A, 7B, 7C, and 7D is disposed in the second circuit block CB2. In other words, in the second circuit block CB2, there can be disposed all or some of the circuits 7A, 7B, 7C, and 7D. Further, the vibration device 1 has a logic circuit 7E as a control circuit, a storage circuit 7F, and an output buffer circuit 7G as the digital circuit DC, and at least one of these circuits 7E, 7F, and 7G is disposed in the first circuit block CB1, and at least one thereof is disposed in the third circuit block CB3. It should be noted that it is possible for all of the circuits 7E, 7F, and 7G to be disposed in the first circuit block CB1.

Here, functions of the circuits 7A through 7G will briefly be described. The constant voltage generation circuit 7A is a circuit for generating a reference voltage used in the integrated circuit 7. The oscillation circuit 7C is a circuit for oscillating the vibration element 4 to output a reference frequency signal. The control voltage generation circuit 7B is a circuit for generating an external control voltage to vary the reference frequency output from the oscillation circuit 7C using the external control voltage. The phase synchronization circuit 7D is a circuit which detects a phase error from the reference frequency signal output from the oscillation circuit 7C and then forms a closed loop so as to vanish the phase error to thereby make the frequency of the output signal constant. The output buffer circuit 7G is a circuit for outputting the frequency signal output from the phase synchronization circuit 7D to the outside. The logic circuit 7E is a control circuit, and is a circuit for performing overall control of the vibration device 1. The storage circuit 7F is a circuit for storing a variety of types of data.

Further, as shown in FIG. 4, on the lower surface 5b of the substrate 5, there are disposed four terminals 76. These four terminals 76 each function as a connection terminal for achieving electrical coupling to the integrated circuit 7. One of the four terminals 76 is a power supply voltage terminal 761 as a power supply terminal, and the integrated circuit 7 is supplied with a power supply voltage VDD via the power supply voltage terminal 761. Further, one of the four terminals 76 is a ground terminal 762 as a power supply terminal, and the integrated circuit 7 is coupled to the ground GND via the ground terminal 762. Further, on the lower surface 5b of the substrate 5, there are disposed two interconnections 77. One of these two interconnections 77 is a power supply voltage interconnection 771 as a power supply interconnection, and is electrically coupled to the power supply voltage terminal 761. Further, the other of these two interconnections 77 is a ground interconnection 772 as a power supply interconnection, and is electrically coupled to the ground terminal 762. It should be noted that the number of the terminals 76 and the number of the interconnections 77 are not particularly limited, and can arbitrarily be set in accordance with the configuration of the integrated circuit 7.

The constituent materials of the terminals 76 and the interconnections 77 are each a metal material. By forming the terminals 76 and the interconnections 77 using the metal materials, it becomes easy to form the terminals 76 and the interconnections 77. It should be noted that the metal materials are not particularly limited, and there can be cited, for example, a variety of types of metal such as nickel (Ni), cobalt (Co), gold (Au), platinum (Pt), silver (Ag), copper (Cu), aluminum (Al), magnesium (Mg), or tungsten (W), or alloys or intermetallic compounds including at least one species of these types of metal. It should be noted that the constituent materials of the terminals 76 and the interconnections 77 are not particularly limited, and it is possible to use electrically-conductive materials other than the metal materials such as electrically-conductive silicon.

Further, as shown in FIG. 5 and FIG. 6, the substrate 5 is provided with six through electrodes 78 penetrating the substrate 5 in the thickness direction, namely a direction along the Z axis. Each of the through electrodes 78 is constituted by, for example, a through hole 78A penetrating the substrate 5 in the thickness direction, the insulating film 50 disposed on the inside wall of the through hole 78A, and an electrically-conductive material 78B filling the through hole 78A. The constituent material of the electrically-conductive material 78B is silicon, in particular, electrically-conductive polysilicon in the present embodiment. The electrically-conductive polysilicon means polysilicon doped with an impurity such as phosphorus (P), boron (B), or arsenic (As) to thereby be provided with electrical conductivity.

As described above, by using polysilicon as the electrically-conductive material 78B, it is possible to increase the electric resistance of the through electrode 78 compared to, for example, when using a metal material as the electrically-conductive material 78B. Further, there are obtained the through electrodes 78 sufficiently resistant to the heat applied thereto in the manufacturing process of the vibration device 1. Therefore, the electric failure due to the through electrodes 78 becomes hard to occur. Further, it is also possible to reduce a difference in linear expansion coefficient from the substrate 5. Therefore, the thermal stress is hard to occur, and thus, the vibration device 1 having the excellent oscillation characteristics is obtained. It should be noted that the electrically-conductive material 78B is not particularly limited, and there can be used a metal material excellent in heat resistance such as tungsten (W).

Further, one of the six through electrodes 78 is a first power supply voltage through electrode 781 as a first through electrode. The first power supply voltage through electrode 781 is disposed so as to overlap the first circuit block CB1 in the plan view from the direction along the Z axis, and electrically couples the power supply voltage interconnection 771 and the first circuit block CB1 to each other. Therefore, the power supply voltage applied to the power supply voltage terminal 761 is supplied to the first circuit block CB1 via the power supply voltage interconnection 771 and the first power supply voltage through electrode 781.

Further, one of the six through electrodes 78 is a second power supply voltage through electrode 782 as a second through electrode. The second power supply voltage through electrode 782 is disposed so as to overlap the second circuit block CB2 in the plan view from the direction along the Z axis, and electrically couples the power supply voltage interconnection 771 and the second circuit block CB2 to each other. Therefore, the power supply voltage applied to the power supply voltage terminal 761 is supplied to the second circuit block CB2 via the power supply voltage interconnection 771 and the second power supply voltage through electrode 782.

Further, one of the six through electrodes 78 is a third power supply voltage through electrode 783 as a third through electrode. The third power supply voltage through electrode 783 is disposed so as to overlap the third circuit block CB3 in the plan view from the direction along the Z axis, and electrically couples the power supply voltage interconnection 771 and the third circuit block CB3 to each other. Therefore, the power supply voltage applied to the power supply voltage terminal 761 is supplied to the third circuit block CB3 via the power supply voltage interconnection 771 and the third power supply voltage through electrode 783.

Further, one of the six through electrodes 78 is a first ground through electrode 784 as the first through electrode. The first ground through electrode 784 is disposed so as to overlap the first circuit block CB1 in the plan view from the direction along the Z axis, and electrically couples the ground interconnection 772 and the first circuit block CB1 to each other. Therefore, the first circuit block CB1 is coupled to the ground via the first ground through electrode 784, the ground interconnection 772, and the ground terminal 762.

Further, one of the six through electrodes 78 is a second ground through electrode 785 as the second through electrode. The second ground through electrode 785 is disposed so as to overlap the second circuit block CB2 in the plan view from the direction along the Z axis, and electrically couples the ground interconnection 772 and the second circuit block CB2 to each other. Therefore, the second circuit block CB2 is coupled to the ground via the second ground through electrode 785, the ground interconnection 772, and the ground terminal 762.

Further, one of the six through electrodes 78 is a third ground through electrode 786 as the third through electrode. The third ground through electrode 786 is disposed so as to overlap the third circuit block CB3 in the plan view from the direction along the Z axis, and electrically couples the ground interconnection 772 and the third circuit block CB3 to each other. Therefore, the third circuit block CB3 is coupled to the ground via the third ground through electrode 786, the ground interconnection 772, and the ground terminal 762.

Out of these six through electrodes 78, the first power supply voltage through electrode 781, the second power supply voltage through electrode 782, and the third power supply voltage through electrode 783 are arranged side by side along the X axis, and the longitudinal direction of each of these through electrodes is parallel to the X axis in the plan view from the direction along the Z axis. Further, the first ground through electrode 784, the second ground through electrode 785, and the third ground through electrode 786 are arranged side by side along the X axis, and each have an elongated shape extending along the X axis in the plan view from the direction along the Z axis. As described above, since the planar shape of each of the through electrodes 78 has the longitudinal direction, it is possible to suppress a rapid current change. Therefore, it is possible to suppress a voltage change due to the current change, and thus, it is possible to more stably drive the integrated circuit 7. It should be noted that the arrangement and the shape of each of the through electrodes 78 are not particularly limited.

Here, as shown in FIG. 7, denoting the electric resistance ($\Omega$) of the first power supply voltage through electrode 781 by $R1_D$ (R1), the electric resistance ($\Omega$) of the second power supply voltage through electrode 782 by $R2_D$ (R2), and the electric resistance ($\Omega$) of the power supply voltage interconnection 771 in a zone E1 coupling the first power supply voltage through electrode 781 and the second power supply voltage through electrode 782 to each other by $R4_D$ (R4), the vibration device 1 fulfills the relationship of $R1_D > R4_D$ and $R2_D > R4_D$. It should be noted that $R1_D$ denotes the electric resistance between the upper end and the lower end of the first power supply voltage through electrode 781, and $R2_D$ denotes the electric resistance between the upper end and the lower end of the second power supply voltage through electrode 782. Further, $R4_D$ denotes the electric resistance between the center $O1_D$ of a coupling part between the power supply voltage interconnection 771 and the first power supply voltage through electrode 781 and the center $O2_D$ of a coupling part between the power supply voltage interconnection 771 and the second power supply voltage through electrode 782.

As described above, by making the electric resistances $R1_D$, $R2_D$ of the first power supply voltage through electrode 781 and the second power supply voltage through electrode 782 higher than the electric resistance $R4_D$ of the zone E1, it becomes difficult for the noise generated in the first circuit block CB1 such as fluctuation of the voltage to be transmitted to the second circuit block CB2 via the first power supply voltage through electrode 781, the zone E1, and the second power supply voltage through electrode 782. Therefore, the analog circuit AC disposed in the second circuit block CB2 becomes difficult to be affected by the noise generated in the first circuit block CB1. Therefore, it is possible to suppress the phase noise of the oscillation circuit 7C to a sufficiently low level. As a result, the vibration device 1 having excellent frequency accuracy is obtained.

As described above, the first and second power supply voltage through electrodes 781, 782 are formed of electrically-conductive polysilicon, and the power supply voltage interconnection 771 is formed of the metal material. Therefore, it is possible to easily fulfill the relationship of $R1_D > R4_D$ and $R2_D > R4_D$.

It should be noted that although the relationship is not particularly limited providing $R1_D > R4_D$ is fulfilled, it is preferable to fulfill $10 \leq R1_D/R4_D \leq 100$, it is more preferable to fulfill $30 \leq R1_D/R4_D \leq 100$, and it is further more preferable to fulfill $50 \leq R1_D/R4_D \leq 100$. Similarly, although the relationship is not particularly limited providing $R2_D > R4_D$ is fulfilled, it is preferable to fulfill $10 \leq R2_D/R4_D \leq 100$, it is more preferable to fulfill $30 \leq R2_D/R4_D \leq 100$, and it is further more preferable to fulfill $50 \leq R2_D/R4_D \leq 100$. Thus, it is possible to make $R1_D$ and $R2_D$ sufficiently higher than $R4_D$ while preventing $R1_D$ and $R2_D$ from becoming excessively high. Therefore, the advantage described above becomes more conspicuous. It should be noted that $R1_D$ and $R2_D$ can be equal to each other, or can also be different from each other.

Further, as shown in FIG. 7, denoting the electric resistance (Ω) of the third power supply voltage through electrode 783 by $R3_D$ (R3), and the electric resistance (Ω) of the power supply voltage interconnection 771 in a zone E2 coupling the second power supply voltage through electrode 782 and the third power supply voltage through electrode 783 to each other by $R5_D$ (R5), the vibration device 1 fulfills the relationship of $R2_D > R5_D$ and $R3_D > R5_D$. It should be noted that $R3_D$ denotes the electric resistance between the upper end and the lower end of the third power supply voltage through electrode 783. Further, $R5_D$ denotes the electric resistance between the center $O2_D$ of a coupling part between the power supply voltage interconnection 771 and the second power supply voltage through electrode 782 and the center $O3_D$ of a coupling part between the power supply voltage interconnection 771 and the third power supply voltage through electrode 783.

As described above, by making the electric resistances $R2_D$, $R3_D$ of the second power supply voltage through electrode 782 and the third power supply voltage through electrode 783 higher than the electric resistance $R5_D$ of the zone E2, it becomes difficult for the noise generated in the third circuit block CB3 to be transmitted to the second circuit block CB2 via the third power supply voltage through electrode 783, the zone E2, and the second power supply voltage through electrode 782 similarly to the case described above. Therefore, the analog circuit AC disposed in the second circuit block CB2 becomes difficult to be affected by the noise generated in the third circuit block CB3. Therefore, it is possible to suppress the phase noise of the oscillation circuit 7C to a sufficiently low level. Further, it is possible to increase the frequency resolution of the oscillation circuit 7C. As a result, the vibration device 1 having excellent frequency accuracy is obtained.

As described above, the second and third power supply voltage through electrodes 782, 783 are formed of electrically-conductive polysilicon, and the power supply voltage interconnection 771 is formed of the metal material. Therefore, it is possible to easily fulfill the relationship of $R2_D > R5_D$ and $R3_D > R5_D$.

It should be noted that although the relationship is not particularly limited providing $R2_D > R5_D$ is fulfilled, it is preferable to fulfill $10 \leq R2_D/R5_D \leq 100$, it is more preferable to fulfill $30 \leq R2_D/R5_D \leq 100$, and it is further more preferable to fulfill $50 \leq R2_D/R5_D \leq 100$. Similarly, although the relationship is not particularly limited providing $R3_D > R5_D$ is fulfilled, it is preferable to fulfill $10 \leq R3_D/R5_D \leq 100$, it is more preferable to fulfill $30 \leq R3_D/R5_D \leq 100$, and it is further more preferable to fulfill $50 \leq R3_D/R5_D \leq 100$. Thus, it is possible to make $R2_D$ and $R3_D$ sufficiently higher than $R5_D$ while preventing $R2_D$ and $R3_D$ from becoming excessively high. Therefore, the advantage described above becomes more conspicuous. It should be noted that $R2_D$ and $R3_D$ can be equal to each other, or can also be different from each other.

Further, as shown in FIG. 7, denoting the electric resistance (Ω) of the first ground through electrode 784 by $R1_G$ (R1), the electric resistance (Ω) of the second ground through electrode 785 by $R2_G$ (R2), and the electric resistance (Ω) of the ground interconnection 772 in a zone E3 coupling the first ground through electrode 784 and the second ground through electrode 785 to each other by $R4_G$ (R4), the vibration device 1 fulfills the relationship of $R1_G > R4_G$ and $R2_G > R4_G$. It should be noted that $R1_G$ denotes the electric resistance between the upper end and the lower end of the first ground through electrode 784, and $R2_G$ denotes the electric resistance between the upper end and the lower end of the second ground through electrode 785. Further, $R4_G$ denotes the electric resistance between the center $O1_G$ of a coupling part between the ground interconnection 772 and the first ground through electrode 784 and the center $O2_G$ of a coupling part between the ground interconnection 772 and the second ground through electrode 785.

As described above, by making the electric resistances $R1_G$, $R2_G$ of the first ground through electrode 784 and the second ground through electrode 785 higher than the electric resistance $R4_G$ of the zone E3, it becomes difficult for the noise generated in the first circuit block CB1 to be transmitted to the second circuit block CB2 via the first ground through electrode 784, the zone E3, and the second ground through electrode 785. Therefore, the analog circuit AC disposed in the second circuit block CB2 becomes difficult to be affected by the noise generated in the first circuit block CB1. Therefore, it is possible to suppress the phase noise of the oscillation circuit 7C to a sufficiently low level. Further, it is possible to increase the frequency resolution of the oscillation circuit 7C. As a result, the vibration device 1 having excellent frequency accuracy is obtained.

As described above, the first and second ground through electrodes 784, 785 are formed of electrically-conductive polysilicon, and the ground interconnection 772 is formed of the metal material. Therefore, it is possible to easily fulfill the relationship of $R1_G > R4_G$ and $R2_G > R4_G$.

It should be noted that although the relationship is not particularly limited providing $R1_G > R4_G$ is fulfilled, it is preferable to fulfill $10 \leq R1_G/R4_G \leq 100$, it is more preferable to fulfill $30 \leq R1_G/R4_G \leq 100$, and it is further more preferable to fulfill $50 \leq R1_G/R4_G \leq 100$. Similarly, although the relationship is not particularly limited providing $R2_G > R4_G$ is fulfilled, it is preferable to fulfill $10 \leq R2_G/R4_G \leq 100$, it is more preferable to fulfill $30 \leq R2_G/R4_G \leq 100$, and it is further more preferable to fulfill $50 \leq R2_G/R4_G \leq 100$. Thus, it is possible to make $R1_G$ and $R2_G$ sufficiently higher than $R4_G$ while preventing $R1_G$ and $R2_G$ from becoming excessively high. Therefore, the advantage described above becomes more conspicuous. It should be noted that $R1_G$ and $R2_G$ can be equal to each other, or can also be different from each other.

Further, as shown in FIG. 7, denoting the electric resistance (Ω) of the third ground through electrode 786 by $R3_G$ (R3), and the electric resistance (Ω) of the ground interconnection 772 in a zone E4 coupling the second ground through electrode 785 and the third ground through electrode 786 to each other by $R5_G$ (R5), the vibration device 1 fulfills the relationship of $R2_G > R5_G$ and $R3_G > R5_G$. It should be noted that $R3_G$ denotes the electric resistance between the upper end and the lower end of the third ground through electrode 786. Further, $R5_G$ denotes the electric resistance between the center $O2_G$ of a coupling part between the ground interconnection 772 and the second ground through electrode 785 and the center $O3_G$ of a coupling part between the ground interconnection 772 and the third ground through electrode 786.

As described above, by making the electric resistances $R2_G$, $R3_G$ of the second ground through electrode 785 and the third ground through electrode 786 higher than the electric resistance $R5_G$ of the zone E4, it becomes difficult for the noise generated in the third circuit block CB3 to be transmitted to the second circuit block CB2 via the third ground through electrode 786, the zone E4, and the second ground through electrode 785 similarly to the case described above. Therefore, the analog circuit AC disposed in the second circuit block CB2 becomes difficult to be affected by the noise generated in the third circuit block CB3. Therefore, it is possible to suppress the phase noise of the oscillation circuit 7C to a sufficiently low level. Further, it is possible to increase the frequency resolution of the oscillation circuit 7C. As a result, the vibration device 1 having excellent frequency accuracy is obtained.

As described above, the second and third ground through electrodes 785, 786 are formed of electrically-conductive polysilicon, and the ground interconnection 772 is formed of the metal material. Therefore, it is possible to easily fulfill the relationship of $R2_G > R5_G$ and $R3_G > R5_G$.

It should be noted that although the relationship is not particularly limited providing $R2_G > R5_G$ is fulfilled, it is preferable to fulfill $10 \leq R2_G/R5_G \leq 100$, it is more preferable to fulfill $30 \leq R2_G/R5_G \leq 100$, and it is further more preferable to fulfill $50 \leq R2_G/R5_G \leq 100$. Similarly, although the relationship is not particularly limited providing $R3_G > R5_G$ is fulfilled, it is preferable to fulfill $10 \leq R3_G/R5_G \leq 100$, it is more preferable to fulfill $30 \leq R3_G/R5_G \leq 100$, and it is further more preferable to fulfill $50 \leq R3_G/R5_G \leq 100$. Thus, it is possible to make $R2_G$ and $R3_G$ sufficiently higher than $R5_G$ while preventing $R2_G$ and $R3_G$ from becoming excessively high. Therefore, the advantage described above becomes more conspicuous. It should be noted that $R2_G$ and $R3_G$ can be equal to each other, or can also be different from each other.

As shown in FIG. 1, the lid 6 is a silicon substrate similarly to the substrate 5. Thus, the substrate 5 and the lid 6 become equal in linear expansion coefficient to each other to prevent the thermal stress caused by the thermal expansion from occurring, and thus, the vibration device 1 having the excellent vibration characteristics is obtained. Further, since it is possible to form the package 3 using the semiconductor process, the vibration device 1 can accurately be manufactured, and at the same time, it is possible to achieve reduction in size thereof. It should be noted that the lid 6 is not particularly limited, and it is possible to use a semiconductor substrate other than silicon such as a semiconductor substrate made of, for example, Ge, GaP, GaAs, or InP.

The lid 6 has a recessed part 61 which has a bottom, opens in the lower surface of the lid 6, and houses the vibration element 4 inside. Further, the lower surface of the lid 6 is bonded to the upper surface 5a of the substrate 5 via a bonding member 8. Thus, a housing space S1 for housing the vibration element 4 is formed between the lid 6 and the substrate 5. The housing space S1 is airtightly sealed, and is set in a reduced-pressure state, and more preferably, in a state approximate to a vacuum state. Thus, the thermal insulation property is enhanced, and at the same time, the viscous resistance decreases, and thus, the oscillation characteristics of the vibration element 4 are improved. It should be noted that the atmosphere in the housing space S1 is not particularly limited, but can be an atmosphere filled with an inert gas such as nitrogen or Ar, or can be in the atmospheric pressure state or a pressurized state instead of the reduced-pressure state.

As shown in FIG. 8, the vibration element 4 has a vibration substrate 41 and electrodes disposed on a surface of the vibration substrate 41. The vibration substrate 41 has a thickness-shear vibration mode, and is formed of an AT-cut quartz crystal substrate in the present embodiment. Since the AT-cut quartz crystal substrate has the third-order frequency-temperature characteristic, the vibration element 4 having the excellent temperature characteristic is obtained. Further, the electrodes include an excitation electrode 421 disposed on an upper surface of the vibration substrate 41, and an excitation electrode 422 disposed on a lower surface so as to be opposed to the excitation electrode 421. Further, the electrodes include a pair of terminals 423, 424 disposed on the lower surface of the vibration substrate 41, an interconnection 425 for electrically coupling the terminal 423 and the excitation electrode 421 to each other, and an interconnection 426 for electrically coupling the terminal 424 and the excitation electrode 422 to each other.

It should be noted that the configuration of the vibration element 4 is not limited to the configuration described above. For example, the vibration element 4 can be provided with a mesa structure in which a vibration area sandwiched between the excitation electrodes 421, 422 protrudes from the periphery of the vibration area, or can also be provided with an inverted-mesa structure in which the vibration area is recessed from the periphery of the vibration area, on the contrary. Further, it is also possible to perform a bevel treatment for grinding the periphery of the vibration substrate 41, or a convex treatment for changing the upper surface and the lower surface to a convex curved surface.

Further, the vibration element 4 is not limited to one vibrating in the thickness-shear vibration mode, and can be, for example, a vibration element having a plurality of vibrating arms making a flexural vibration in an in-plane direction. In other words, the vibration substrate 41 is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Further, the vibration substrate 41 is formed of the quartz crystal in the present embodiment, but this is not a limitation, and it is possible for the vibration substrate 41 to be formed of a piezoelectric single-crystal body made of, for example, lithium niobate, lithium tantalate, lithium tetraborate, langasite, potassium niobate, or gallium phosphate, or to be formed of another piezoelectric single-crystal body than these. Furthermore, the vibration element 4 is not limited to the piezoelectrically-actuated vibration element, but can be an electrostatically-actuated vibration element using electrostatic force.

The vibration element 4 having such a configuration is supported on the upper surface 5a side of the substrate 5 with bonding members B1, B2 having electrical conductivity. Specifically, the vibration element 4 is cantilevered on an upper surface side of the wiring layer 70 of the integrated circuit 7 via the bonding members B1, B2. Further, on the upper surface of the wiring layer 70, there are disposed terminals 791, 792 electrically coupled to the integrated circuit 7 via the interconnections 701, the terminal 423 and the terminal 791 are electrically coupled to each other by the bonding member B1, and the terminal 424 and the terminal 792 are electrically coupled to each other by the bonding member B2. Thus, the vibration element 4 and the integrated circuit 7 are electrically coupled to each other.

The bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to prevent a change in environment, in particular rise in pressure, of the housing space S1. On the other hand, when using the electrically conductive adhesive which is in the latter group as the bonding members B1, B2, the bonding members B1, B2 become soft compared to the metal bumps, and it becomes difficult for a stress to reach the vibration element 4.

The vibration device 1 is hereinabove described. As described above, such a vibration device 1 includes the substrate 5 having the upper surface 5a as the first surface and the lower surface 5b as the second surface at the opposite side to the upper surface 5a, the vibration element 4 disposed on the upper surface 5a side of the substrate 5, the first circuit block CB1 disposed on the upper surface 5a, the second circuit block CB2 disposed on the upper surface 5a and including the analog circuit AC, the power supply voltage terminal 761 as the power supply terminal disposed on the lower surface 5b, the power supply voltage interconnection 771 as the power supply interconnection disposed on the lower surface 5b and coupled to the power supply voltage terminal 761, the first power supply voltage through electrode 781 as the first through electrode penetrating the substrate 5 and electrically coupling the power supply voltage interconnection 771 and the first circuit block CB1 to each other, and the second power supply voltage through electrode 782 as the second through electrode penetrating the substrate 5 and electrically coupling the power supply voltage interconnection 771 and the second circuit block CB2 to each other in parallel to the first power supply voltage through electrode 781. Further, denoting the electric resistance of the first power supply voltage through electrode 781 by $R1_D$, the electric resistance of the second power supply voltage through electrode 782 by $R2_D$, and the electric resistance of the power supply voltage interconnection 771 in the zone E1 coupling the first power supply voltage through electrode 781 and the second power supply voltage through electrode 782 to each other by $R4_D$, there exists the relationship of $R1_D > R4_D$ and $R2_D > R4_D$.

Thus, it becomes difficult for the noise generated in the first circuit block CB1 such as the fluctuation of the voltage to be transmitted to the second circuit block CB2 via the first power supply voltage through electrode 781, the zone E1, and the second power supply voltage through electrode 782. Therefore, the analog circuit AC disposed in the second circuit block CB2 becomes difficult to be affected by the noise generated in the first circuit block CB1. Therefore, it is possible to suppress the phase noise of the oscillation circuit 7C to a sufficiently low level. Further, it is possible to increase the frequency resolution of the oscillation circuit 7C. As a result, the vibration device 1 having excellent frequency accuracy is obtained.

Further, as described above, the vibration device 1 includes the ground terminal 762 as the power supply terminal disposed on the lower surface 5b, the ground interconnection 772 as the power supply interconnection disposed on the lower surface 5b and coupled to the ground terminal 762, the first ground through electrode 784 as the first through electrode penetrating the substrate 5 and electrically coupling the ground interconnection 772 and the first circuit block CB1 to each other, and the second ground through electrode 785 as the second through electrode penetrating the substrate 5 and coupling the ground interconnection 772 and the second circuit block CB2 to each other in parallel to the first ground through electrode 784. Further, denoting the electric resistance of the first ground through electrode 784 by $R1_G$, the electric resistance of the second ground through electrode 785 by $R2_G$, and the electric resistance of the ground interconnection 772 in the zone E3 coupling the first ground through electrode 784 and the second ground through electrode 785 to each other by $R4_G$, there exists the relationship of $R1_G > R4_G$ and $R2_G > R4_G$.

Thus, it becomes difficult for the noise generated in the first circuit block CB1 such as the fluctuation of the voltage to be transmitted to the second circuit block CB2 via the first ground through electrode 784, the zone E3, and the second ground through electrode 785. Therefore, the analog circuit AC disposed in the second circuit block CB2 becomes difficult to be affected by the noise generated in the first circuit block CB1. Therefore, it is possible to suppress the phase noise of the oscillation circuit 7C to a sufficiently low level. Further, it is possible to increase the frequency resolution of the oscillation circuit 7C. As a result, the vibration device 1 having excellent frequency accuracy is obtained.

It should be noted that it is possible to fulfill only either one of the relationship of $R1_D > R4_D$ and $R2_D > R4_D$, and the relationship of $R1_G > R4_G$ and $R2_G > R4_G$. It should be noted that by fulfilling both of the relationships as in the case of the present embodiment, the influence of the noise can further be reduced.

Further, as described above, the constituent material of the power supply voltage interconnection 771 is the metal material, and the constituent materials of the first power supply voltage through electrode 781 and the second power supply voltage through electrode 782 are electrically-conductive polysilicon. Thus, it is possible to easily realize the relationship of $R1_D > R4_D$ and $R2_D > R4_D$. Similarly, the constituent material of the ground interconnection 772 is the metal material, and the constituent materials of the first ground through electrode 784 and the second ground through electrode 785 are electrically-conductive polysilicon. Thus, it is possible to easily realize the relationship of $R1_G > R4_G$ and $R2_G > R4_G$.

Further, as described above, the second circuit block CB2 includes at least one of the constant voltage generation circuit 7A, the oscillation circuit 7C, the control voltage generation circuit 7B, and the phase synchronization circuit 7D as the analog circuit AC. Thus, at least one of these circuits 7A through 7D becomes difficult to be affected by the noise.

Further, as described above, the first circuit block CB1 includes at least one of the logic circuit 7E as a logic circuit, the storage circuit 7F, and the output buffer circuit 7G. Thus, it becomes difficult for the noise generated in at lease one of these circuits 7E through 7G to be transmitted to the second circuit block CB2.

Although the vibration device according to the present application example is described hereinabove based on the illustrated embodiment, the present application example is not limited to the embodiment, but the configuration of each of the components can be replaced with one having an equivalent function and an arbitrary configuration. Further, it is also possible to add any other constituents to the present application example. Further, the present application example can be a combination of any two or more configurations of the embodiment described above.

What is claimed is:

1. A vibration device comprising:
    a substrate having a first surface and a second surface at an opposite side to the first surface;
    a vibration element disposed on the first surface of the substrate;
    a first circuit block disposed on the first surface;
    a second circuit block disposed on the first surface and including an analog circuit;
    a power supply terminal disposed on the second surface;
    a power supply interconnection disposed on the second surface, and coupled to the power supply terminal;
    a first through electrode which penetrates the substrate, and is configured to electrically couple the power supply interconnection and the first circuit block to each other; and
    a second through electrode which penetrates the substrate, and is configured to electrically couple the power supply interconnection and the second circuit block to each other in parallel to the first through electrode, wherein $R1>R4$ and $R2>R4$ in which R1 is an electric resistance of the first through electrode, R2 is an electric resistance of the second through electrode, and R4 is an electric resistance of a zone of the power supply interconnection coupling the first through electrode and the second through electrode to each other.

2. The vibration device according to claim 1, wherein
    a constituent material of the power supply interconnection is a metal material, and
    a constituent material of the first through electrode and the second through electrode is electrically-conductive polysilicon.

3. The vibration device according to claim 1, wherein
    the second circuit block includes at least one of a constant voltage generation circuit, an oscillation circuit, a control voltage generation circuit, and a phase synchronization circuit as the analog circuit.

4. The vibration device according to claim 1, wherein
    the first circuit block includes at least one of a logic circuit, a storage circuit, and an output buffer circuit.

* * * * *